United States Patent
Dietz et al.

(10) Patent No.: US 9,638,775 B2
(45) Date of Patent: May 2, 2017

(54) CONNECTING DEVICE FOR A MAGNETIC SYSTEM OF AN IMAGING SYSTEM

(71) Applicants: Peter Dietz, Fuerth (DE); Andreas Krug, Fuerth (DE); Joerg Riegler, Fuerth (DE)

(72) Inventors: Peter Dietz, Fuerth (DE); Andreas Krug, Fuerth (DE); Joerg Riegler, Fuerth (DE)

(73) Assignee: Siemens Aktiengesellschaft, München (DE)

( * ) Notice: Subject to any disclaimer, the term of this patent is extended or adjusted under 35 U.S.C. 154(b) by 1246 days.

(21) Appl. No.: 13/645,502

(22) Filed: Oct. 4, 2012

(65) Prior Publication Data

US 2013/0090002 A1    Apr. 11, 2013

(30) Foreign Application Priority Data

Oct. 5, 2011  (DE) .......................... 10 2011 084 021

(51) Int. Cl.
*H01R 33/975* (2006.01)
*G01R 33/385* (2006.01)

(52) U.S. Cl.
CPC ........ *G01R 33/3854* (2013.01); *H01R 33/975* (2013.01)

(58) Field of Classification Search
CPC .. G01R 33/3854; G01R 33/36; H01R 13/187; H01R 33/975
USPC ......... 324/318–322; 439/382, 578, 700, 816, 439/843
See application file for complete search history.

(56) References Cited

U.S. PATENT DOCUMENTS

| 8,668,188 | B2* | 3/2014 | Gnateski | ................. F16F 1/028 267/136 |
| 8,952,696 | B2* | 2/2015 | Krug | ..................... G01R 33/36 324/318 |
| 2001/0022515 | A1 | 9/2001 | Yamashita et al. | |
| 2004/0178792 | A1* | 9/2004 | Edelstein | ........... G01R 33/3854 324/318 |
| 2007/0164743 | A1* | 7/2007 | Takamori | ........... G01R 33/3854 324/318 |

(Continued)

FOREIGN PATENT DOCUMENTS

DE    10 2008 021 358 A1    11/2009

OTHER PUBLICATIONS

German Office Action dated May 14, 2012 for corresponding German Patent Application No. DE 10 2011 084 021.4 with English translation.

*Primary Examiner* — Melissa Koval
*Assistant Examiner* — Rishi Patel
(74) *Attorney, Agent, or Firm* — Lempia Summerfield Katz LLC

(57) ABSTRACT

A connecting device for a magnetic system of an imaging system includes a holding element for connection of the connecting device to a power supply connection of the magnetic system, and a connecting element for connection of the connecting device to a power supply cable for operation of the magnetic system. The connecting device also includes an oscillation damping device having a spring element. The oscillation damping device is operable to dampen oscillations of the magnetic system that act on the connecting device by way of the holding element, with respect to the connecting element.

20 Claims, 5 Drawing Sheets

(56) References Cited

U.S. PATENT DOCUMENTS

2008/0200067 A1\* 8/2008 Schuster .............. H01R 13/187
  439/581
2009/0267605 A1 10/2009 Dietz et al.

\* cited by examiner

CONNECTING DEVICE FOR A MAGNETIC SYSTEM OF AN IMAGING SYSTEM

This application claims the benefit of DE 10 2011 084 021.4, filed on Oct. 5, 2011, which is hereby incorporated by reference.

BACKGROUND

The present embodiments relate to a connecting device for a magnetic system of an imaging system.

Imaging systems that are based on a magnetic resonance measurement method (e.g., of nuclear spins; magnetic resonance scanners) are used in a wide variety of applications.

In a known method of this type of image acquisition, a static basic magnetic field used for initial orientation and homogenization of magnetic dipoles that are to be examined is superimposed by a fast-switched magnetic field (e.g., the gradient field) for spatial resolution of the imaging signal. Different switching sequences and magnetic field strengths are applied depending on the operating mode of the imaging system. The gradient magnet for producing the gradient field may be a fast-switched electrically operated magnet in this connection.

As a result of the interaction of the gradient magnet with the basic magnetic field, which may have high magnetic field strengths of a few tesla, the gradient magnet is exposed to immense load forces. The gradient magnet or a gradient coil for producing the gradient field is excited as a function of the respective operating state of the imaging system to form strong mechanical oscillations that depend on the damping due to the mounting of the gradient magnet, the frequency of switching of the gradient field, and the basic magnetic field strength. The strong mechanical oscillations result in the formation of natural oscillations of the gradient coil or gradient magnet.

The production of fast-switched magnetic fields, which in the case of the gradient coil may be several 10 mT/m, results in a high power dissipation and causes the supply and switching of several 100 A of operating current strength. A relatively solid design of the operating current supply cables with large cable cross-sections is to be provided in this case.

The largely rigid construction of the supply cable leads to the problem of operating current cables shearing from connections of the gradient coil or the cables breaking due to continuous mechanical weakening during the course of operation.

SUMMARY AND DESCRIPTION

The present embodiments may obviate one or more of the drawbacks or limitations in the related art. For example, a connecting device that reduces or eliminates the problems identified above is provided.

One embodiment of a connecting device for a magnetic system of an imaging system includes a holding element for mechanical and electrical connection of the connecting device to a power supply connection of the magnetic system, a connecting element for mechanical and electrical connection of the connecting device to a power supply cable for operation of the magnetic system and an oscillation damping device having a spring element. The oscillation damping device is configured to dampen oscillations of the magnetic system that act on the connecting device via the holding element, with respect to the connecting element.

The oscillations include translatory and rotary movements or oscillations, even of a low amplitude (e.g., vibrations). A periodicity of the oscillations is possible but not required.

The imaging system may be configured, for example, for carrying out magnetic resonance measurements (e.g., may be a magnetic resonance scanner). Other imaging systems such as, for example, magnetic systems (e.g., switchable magnetic systems) may also be used.

The magnetic system may, for example, include one or more magnet(s) that may be combined to form a substantially rigid unit, or form a unit. The magnets may be electrically operated magnetic coils, although other switchable magnets that may be mechanically rotatably mounted, for example, may also be used. The magnetic system may be a gradient magnetic system (e.g., a gradient magnet or gradient coil) for producing a gradient field for a magnetic resonance scanner. The magnetic system (e.g., the gradient coil) may be configured to independently vary the strength of the magnetic field produced in at least three spatial directions that are different from each other.

The connecting device may effectively prevent oscillations of the magnetic system that occur during operation from being transferred to the power supply cables. The oscillation damping device may cause mechanical decoupling of the magnetic system from the corresponding power supply cables (e.g., in a frequency range relevant to operation of the magnetic system). In this respect, the oscillation damping device may also be an oscillation decoupling device. Complete decoupling is not always possible, however, so damping of the oscillation propagation to the power supply cables may be provided. Further elements of the imaging system may also be decoupled from oscillations that propagate via power supply cables of the magnetic system. Also, higher operating reliability of the magnetic system and the power supply may be achieved.

One embodiment of a magnetic system for an imaging system includes a connecting device having a holding element that mechanically and electrically connects the connecting device to a power supply connection of the magnetic system. The connecting device includes a connecting element that mechanically and electrically connects the connecting device to a power supply cable for operation of the magnetic system, and an oscillation damping device with a spring element. The oscillation damping device is configured to dampen oscillations of the magnetic system that act on the connecting device by way of the holding element, with respect to the connecting element.

The connecting device may be permanently connected or reversibly detachably connected to the magnetic system. The advantages of the connecting device described above may be transferred to the combination with the magnetic system.

One embodiment of an imaging system includes a magnetic system having or connected to a connecting device. The connecting device includes a holding element that mechanically and electrically connects the connecting device to a power supply connection of the magnetic system, and a connecting element that mechanically and electrically connects the connecting device to a power supply cable for operation of the magnetic system. The connecting device includes an oscillation damping device having a spring element. The oscillation damping device is configured to dampen oscillations of the magnetic system that act on the connecting device by way of the holding element, with respect to the connecting element.

The advantages described above of decoupling the magnetic movement from power supply cables also relate to the imaging system.

In one embodiment of a method for connecting a power supply cable to a magnetic system of an imaging system, a connecting device is mechanically and electrically connected by a holding element to a power supply connection of the magnetic system and is mechanically and electrically connected by a connecting element to the power supply cable for operation of the magnetic system. The connecting device includes an oscillation damping device having a spring element. The oscillation damping device is configured to dampen oscillations of the magnetic system that act on the connecting device by way of the holding element, with respect to the connecting element.

The method achieves the advantages described above for the connecting element, the magnetic system and the imaging system.

One category of the present embodiments (e.g., the method) may also be developed analogously to another category of the present embodiments (e.g., the connecting element).

The oscillation damping device includes a spring element or, in one variant, is formed by a spring element. A simple possibility for achieving adjustable and predictable damping or decoupling between holding element and connecting element is therefore provided. Geometric variation and suitable choice of material, which determines the spring stiffness, for example, provides that damping or resonance properties of spring elements may be effectively predicted.

During operation, the magnetic system executes an oscillation with one or more natural frequencies. To improve oscillation absorption or oscillation decoupling, the oscillation damping device has a natural frequency that is lower than a lowest relevant natural frequency of the oscillations (e.g., the vibration or translatory movement) of the magnetic system. "Relevant" in this connection may be that the natural frequencies (e.g., owing to the symmetries of excitation) are excited by the conductive paths of the gradient coils. The relevant natural frequencies are at least about 560 Hz.

A further variable that may determine oscillation propagation during operation of the magnetic system is the natural oscillation spectrum of the power supply cables. In one embodiment, the natural frequency of the damping device is higher than the frequency of the natural oscillations of the power supply arrangement of the imaging system or the components of the power supply arrangement including, for example, the power supply cables (e.g., the natural oscillations of the power supply cable). The situation may therefore be avoided, for example, where the oscillation power consumption of the power supply cables is unintentionally resonantly raised by the decoupling or damping device.

The advantages already mentioned of mechanical decoupling or oscillation damping may therefore be achieved, since the oscillation energy, for example, is therefore absorbed in the connecting device, and no resonances to the natural oscillations of the magnetic system and/or power supply arrangement or power supply cable occur.

The connecting device is substantially produced from a conductive material (e.g., from metal). "Substantially" may be that the majority of elements of the connecting device is formed from a conductive material. Smaller elements (e.g., washers, latching devices, and brackets) may be constructed from a different material.

This results in a range of advantages. During operation of the magnetic system, frictional heat is produced in the region of the connecting device due to the relative movement between magnetic system and power supply cable. With a conductive or metal construction, the high temperatures that occur do not have a destructive effect on the oscillation damping device, for example. Metals have good thermal conductivity, so the heat that occurs may be dissipated by metal surface sections of the connecting device. The surface sections are therefore simultaneously constructed as heat sinks and have a corresponding function, for example.

One embodiment provides that the connecting device is formed by the holding element, the oscillation damping device and the connecting element.

The spring element may be formed by a spring ring or a ring spring element. These may fix a preferred direction or preferred plane of damping that is oriented, for example, parallel to the plane of the ring structure (e.g., the cross-sectional surface of the spring ring or the plane, in which the ring is located), while the normal direction of the plane, which coincides with the direction of an axis of an opening of the ring structure, is largely unaffected by damping due to the ring structure.

Developments of the spring ring element are not limited to a circular ring, however. The spring ring element may have any other desired closed structure (e.g., an elliptical cross-section of the spring ring).

The spring ring element may include a sheet metal strip that is shaped into a plurality of ring windings arranged one above the other to form a closed structure.

The position of the connecting element and the holding element on the closed structure of the spring element, for example, determines the damping or decoupling properties (e.g., the preferred damping direction of the connecting device), so advantageous adjustment options of oscillation damping result with a closed spring element structure.

To adjust the damping properties, the arrangement of the holding element or connecting element, for example, is adjustable with respect to the oscillation damping device.

A development for adjustment may also provide that the oscillation damping device includes a plurality of damping elements (e.g., coupled to each other) for adjustment of the damping properties.

In one embodiment, the arrangement of the damping elements or spring elements is adjustable relative to each other to make the damping properties of the connecting device adjustable.

The resonance frequencies or natural frequencies of the spring elements or damping elements may differ in this case, resulting in adjustable damping properties. For example, a band of frequencies that are to be damped may be determined easily.

With use of a plurality of damping elements, each of the damping elements may damp oscillations (e.g., vibrations or translatory forces) in mutually different spatial directions. Different damping behavior may therefore be adjusted for different spatial directions, and the connecting device may be adjusted to specific operating modes of the magnetic system or to different frequency bands of oscillations in different spatial directions.

Oscillations in the normal direction of the ring plane of the ring spring elements are barely damped or not damped at all. If an embodiment includes, for example, the combination of a plurality of ring spring elements, the ring planes or cross-sectional areas of the spring elements may be arranged in different directions to each other. One spatial direction of damping may thus be associated with one ring spring element, respectively, while the combination of damping properties of a plurality of ring spring elements respectively determines damping for the other remaining spatial directions.

In one embodiment, the connecting device is configured to guide an operating current of the magnetic system of the imaging system from the power connection device to the connecting element. This power guidance may occur, for example, with the aid of the oscillation damping device. The spring element may therefore contribute to the supply of power of the magnetic system or to power transfer to the magnetic system.

In this case, a power supply cable is only connected to the magnetic system by the connecting device, so effective decoupling of the magnetic system from the power supply system or the power supply arrangement, which, for example, includes the power supply cables and, optionally, distribution elements, is achieved.

One embodiment of a magnetic system or an imaging system may be provided, for example, such that the magnetic system includes a plurality of connecting devices. A plurality of connecting devices are coupled to each other by a common power supply cable. For example, the power supply cable may be a cable with an internal conductor and an external conductor (e.g., a coaxial cable). A connecting device may be associated with each conductor of the cable.

Each of the connecting devices may be constructed so as to be the same. A variation in the length of the associated power supply cables may be advantageous to achieve different damping properties in the plurality of connecting devices.

BRIEF DESCRIPTION OF THE DRAWINGS

The same components are provided with the same reference characters in the various figures, in which.

DETAILED DESCRIPTION OF THE DRAWINGS

Figure 1:
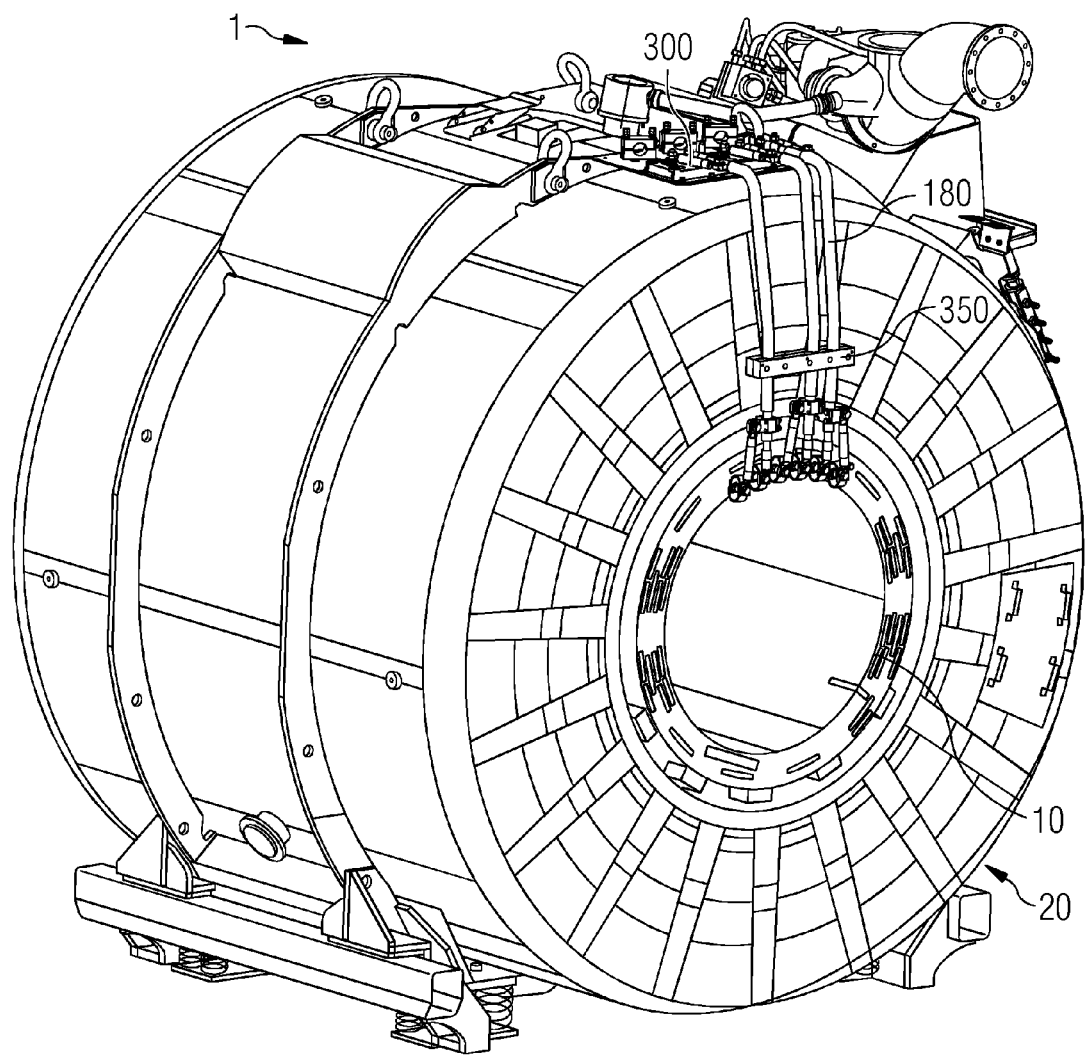
FIG. 1 shows an exemplary embodiment of a magnetic system, implemented for a magnetic resonance scanner (MRT)

FIG. 1 shows an exemplary embodiment of an imaging system 1 (e.g., a magnetic resonance scanner) having a basic magnetic system 20. The magnetic system 20 is an electromagnet for producing high static homogeneous magnetic fields in the tesla range (e.g., superconducting magnetic coils encapsulated and cooled by a housing).

The high static and optimally homogeneous basic magnetic field causes a basic orientation of the magnetic dipoles in the material or tissue of an object to be examined for magnetic resonance evaluation (e.g., an orientation of the "spins"). The strength of the static basic magnetic field also influences the signal-to-noise ratio of the magnetic resonance signal, so, depending on the operating mode, magnetic fields in a range between 1 T and 7 T or, in the case of newer devices, even higher are produced by the magnetic system 20 for optimum generation of an imaging magnetic resonance signal.

In the exemplary embodiment, the magnetic system 20 includes a central opening (e.g., a "patient tunnel"), in which the object or person to be examined is movably located on a table. The homogeneous basic magnetic field is applied in a middle region of the central opening during operation of the imaging system 1.

A further magnetic system 10 (e.g., a gradient magnet 10) is arranged in the central opening or the patient tunnel. The further magnetic system 10 is used for spatial encoding of a magnetic resonance signal with the aid of a locally varied magnetic field (e.g., the gradient field). In the illustrated exemplary embodiment, this is an arrangement of electromagnets that achieve fast switching sequences of the gradient field depending on the desired operating mode of the imaging system 1.

The variation in the gradient field may be independently adjusted for a plurality of spatial directions, so the gradient magnet 10 supports a large number of different switching sequences and operating modes of the imaging system 1. The gradient magnet 10 includes, for example, a plurality of coils that are arranged such that the gradients of the magnetic fields the plurality of coils produce have different main directions that run orthogonally to each other, for example, and may be "gradients running in the x, y and z directions," by way of example. A plurality of magnets may, for example, also be associated with the main directions (e.g., as primary coils for producing the desired gradient field in the patient tunnel, and secondary coils that, for partial compensation of the respectively produced magnetic fields, have an antiparallel magnetic field characteristic in the respective main direction to achieve outward shielding).

Owing to the arrangement in the basic magnetic field, the fast-switched gradient magnet 10 experiences strong interaction forces that cause translations, vibrations and other oscillations of the gradient magnet 10. During operation, a large number of possible natural oscillations or oscillation modes of the gradient magnet 10 form. In the exemplary embodiment, natural oscillations of the gradient magnet 100 with natural frequencies of more than 560 Hz are relevant (e.g., excitable) during operation.

Figure 2:
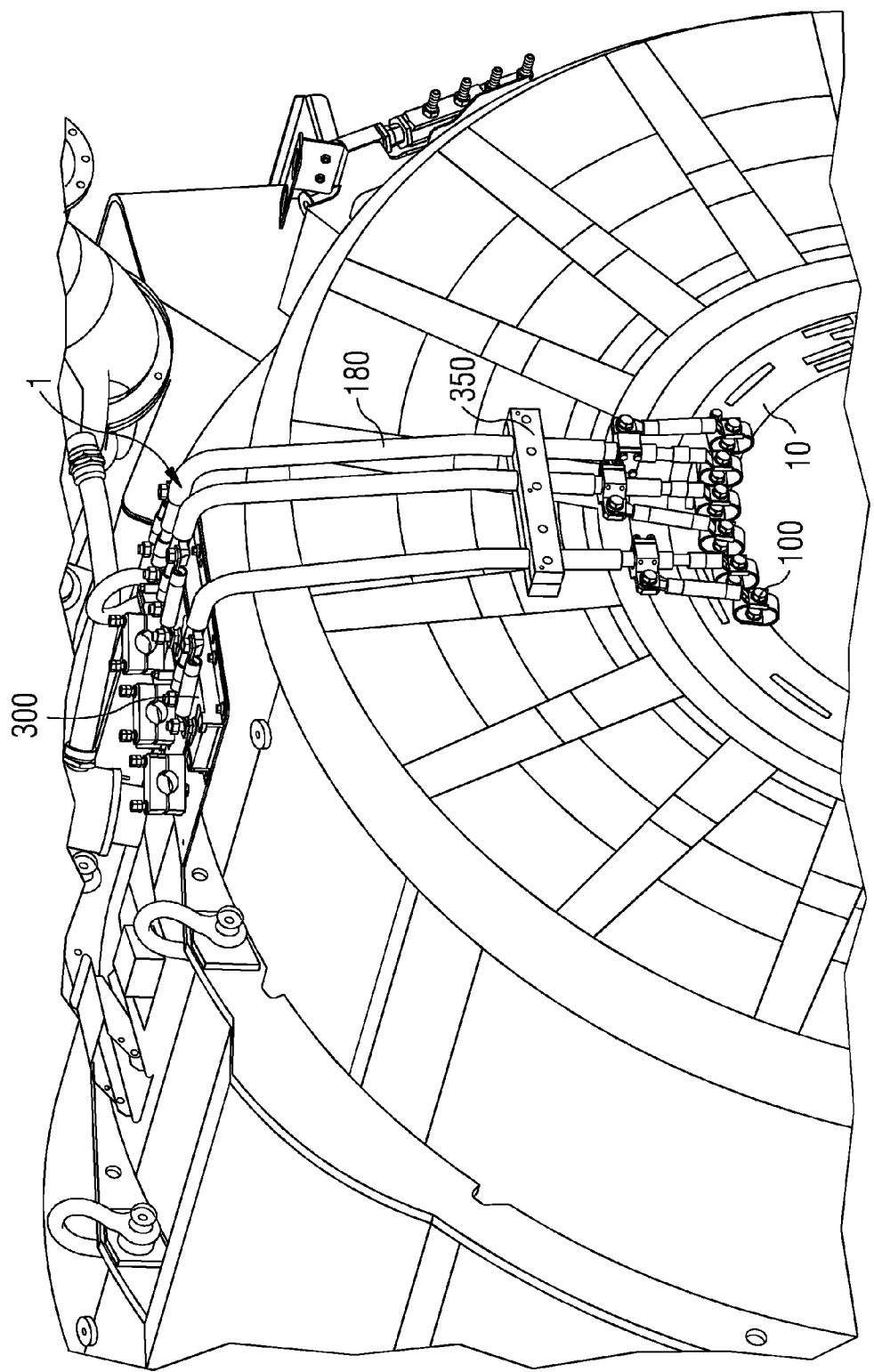
FIG. 2 shows parts of one embodiment of a power supply system of the magnetic system according to FIG. 1.

The power supply arrangement of the gradient magnet 10, which, for example, includes the operating current supply of the gradient magnet 10, is implemented in the exemplary embodiment of FIG. 1 with the aid of a distribution element 300 (e.g., a central connection plate and a number of power supply cables 180). FIG. 2 makes this clear. The distribution element 300 fixes the power supply cables 180 for operation of the gradient magnet 10 and, in the illustrated exemplary embodiment, includes connectors such as, for example, screw terminals or plug-in connection systems to connect the power supply cables 180 to switching outputs of a control system (not illustrated) of the imaging system 1 or magnetic resonance scanner.

The magnetic resonance scanner system includes a large number of additional components (e.g., a whole body coil arranged around the patient tunnel, inside the magnetic system for emitting high-frequency pulses for spin excitation), although the additional components are not shown in FIG. 1 for reasons of clarity. The construction of an MRT is known to the person skilled in the art, however, and therefore is not described further.

To provide the accessibility of the power supply cables 180, the distribution element 300 may be arranged, for example, on the outside of a housing of the magnetic system 20 (e.g., of the basic magnet 20; on the outside or an upper side). Access is then easily achieved via a flap (not illustrated) in the surrounding housing of the imaging system 1.

A stable arrangement of the power supply cables 180 is therefore also achieved in relation to the imaging system 1 or MRT.

In the exemplary embodiment of FIG. 1 and FIG. 2, the distribution element 300 includes a connecting device for three power supply cables 180. The power supply cables 180 on the outside of the housing of the magnetic system 20 lead from the distribution element 300 to a further fixing element 350 that connects the three power supply cables 180 to each other. For example, the three power supply cables 180 are used for independent control of the gradient field spatial directions that are orthogonal to each other.

The power supply cable 180 may be led almost rigidly between these two elements (e.g., the distribution element 300 and the fixing element 350) without there being an excessive risk of oscillations of the gradient magnet 10 damaging the power supply cables 180. In the illustrated exemplary embodiment, the power supply cable 180 is a coaxial cable that is simultaneously provided as the supply and return cable of the operating current and therefore has the advantage that during operation, the power supply cable 180 has self-compensation with respect to the force effect of an external magnetic field (e.g., of the basic magnetic field) on the coaxial cable. In one embodiment, cable cross-sections for reliable power supply of the gradient magnet 10 lie in a range between 50 $mm^2$ and 150 $mm^2$ (e.g., between 70 $mm^2$ and 120 $mm^2$), so this configuration enables the safe and stable arrangement of the power supply cables 180.

According to one embodiment, the fixing element 350 may include a vibrations-damping device, for example, to dampen an oscillation propagation via the power supply cable 180. In the exemplary embodiment, the fixing element 350 includes a connection strip that allows vibration damping to be adjusted via the severity of the clamping effect. Resilient bearing regions for the power supply cables 180 may be provided on the fixing element 350 for this purpose.

Following the fixing element 350, the power supply cables 180 of the exemplary embodiment of FIG. 1 or FIG. 2 are connected to a connecting device 100 that is electrically and mechanically connected to power supply connections of the gradient magnet 10.

The region between the fixing element 350 and a connecting ring or connecting frame of the gradient magnet 10 includes a section of the power supply cables 180 that experiences particularly strong movement or oscillation or vibration of the gradient magnet 10 and is therefore at particular risk of mechanical damage.

Figure 3:
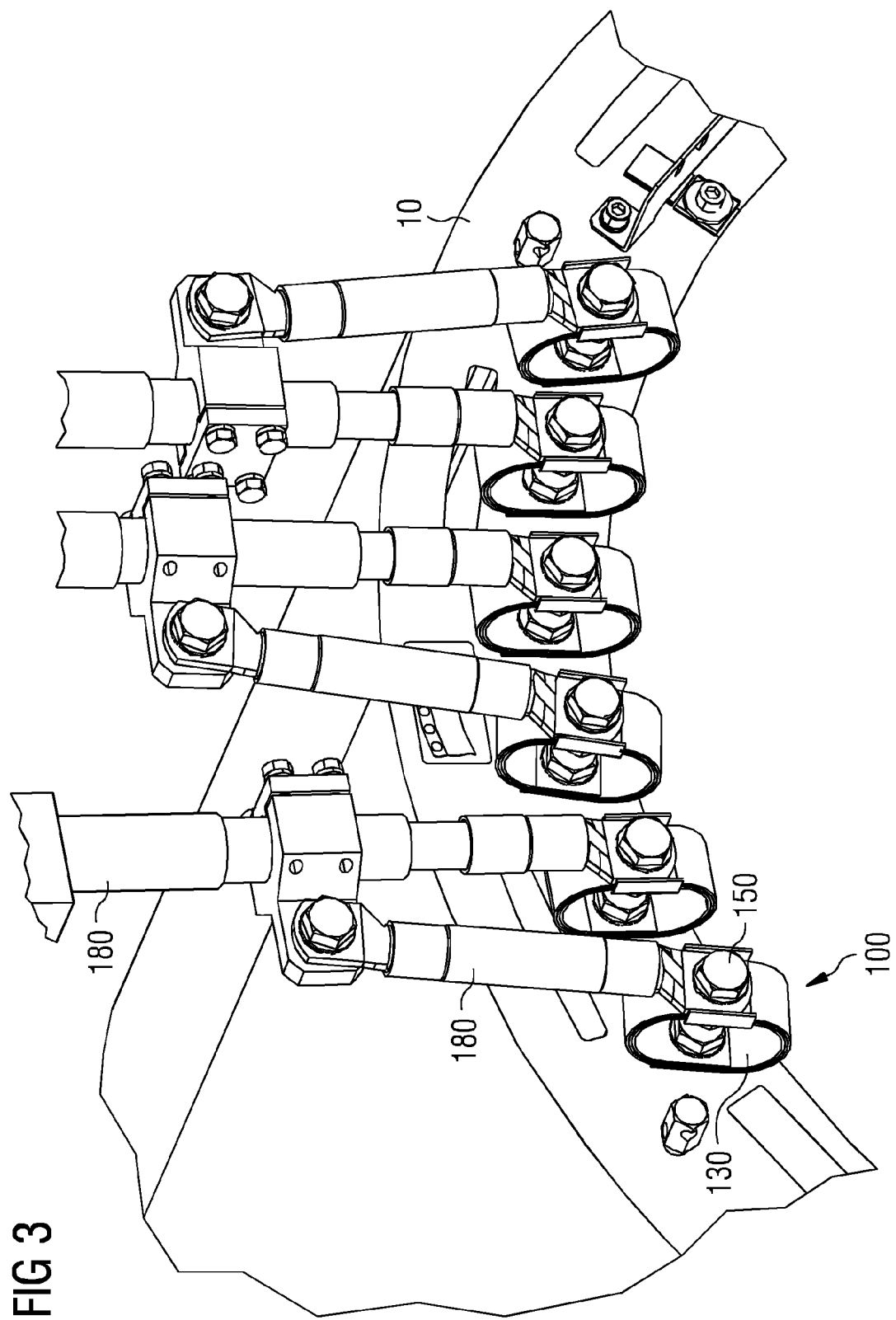
FIG. 3 shows exemplary embodiments of connecting devices in connection with the magnetic system according to FIGS. 1 and 2.

As shown, for example, in FIG. 3, each of the three power supply cables 180 has a branch that implements a connection to one connecting element 100, respectively, which is likewise arranged on the connecting ring or connecting frame of the gradient magnet 10.

The connections to the distribution element 300 may also be implemented in the same way with corresponding branches of the power supply cables 180, as is shown, for example, in FIG. 2. FIG. 2 shows the arrangement of the distribution element 300, the fixing element 350 and a plurality of connecting devices 100 of the gradient magnet 10 in detail.

Figure 4:
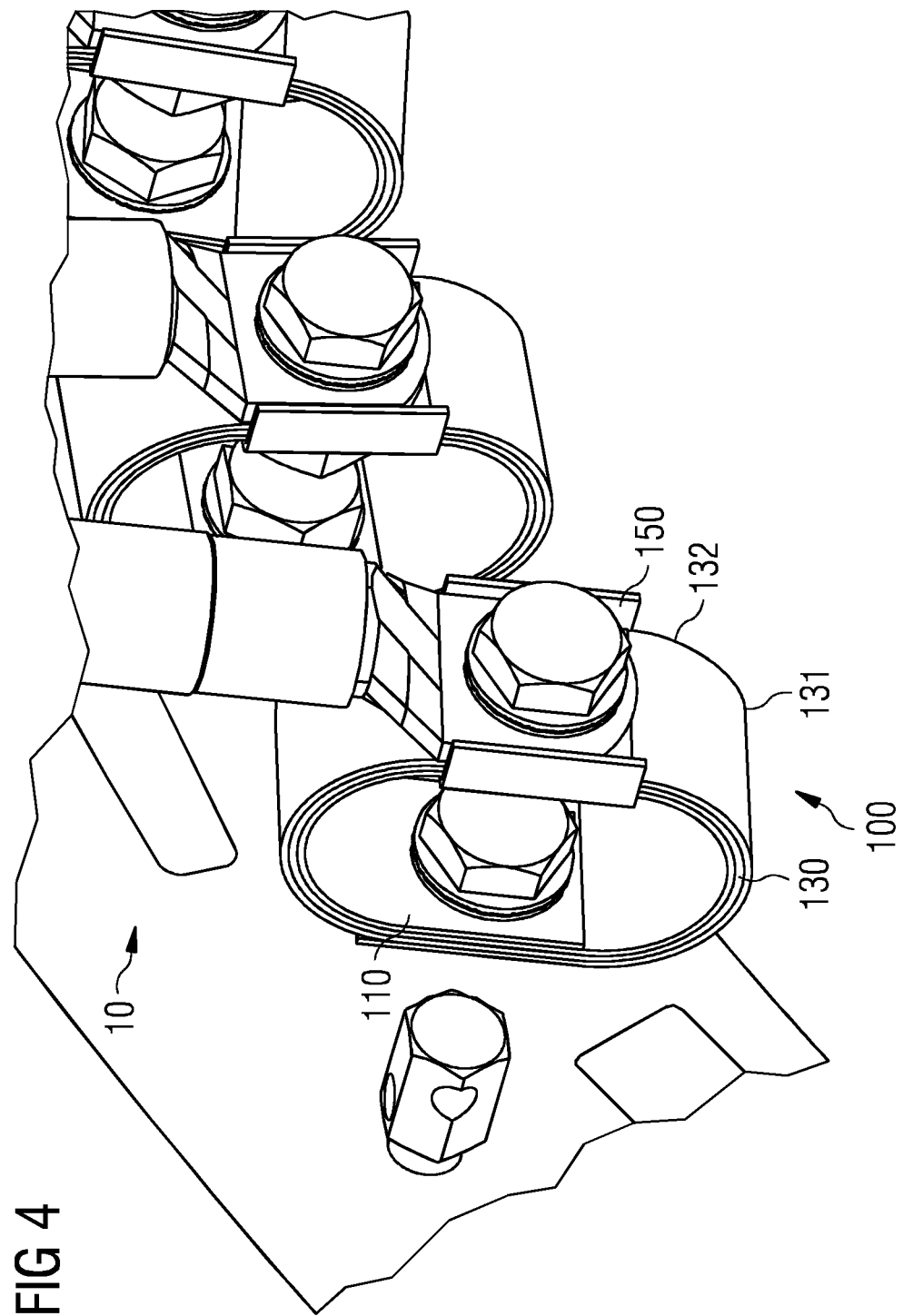
FIG. 4 shows an exemplary embodiment of a connecting device according to FIG. 3.

FIGS. 3 and 4 reproduce the arrangement of the connecting devices 100 of the exemplary embodiment of FIGS. 1 and 2 in more detail and make the advantageous effect of the connecting devices 100 clear.

The connecting device 100 includes a holding element 110 that is or may be connected to the power supply connections of the gradient magnet 10.

The connection may be a reversibly detachable connection (e.g., a screw connection), so the connecting device 100 may be replaced quickly if necessary or may be adapted to other requirements.

The holding element 110 may advantageously include securing mechanisms (e.g., grooves, projections or lugs) that prevent rotation of the holding element 110 with respect to the gradient magnet 10, for example. In one embodiment, a detachable connection may be implemented by a latching device.

In one embodiment, for reasons of operating reliability, the connection to the connecting device 100 may be configured, at least in certain sections, in one piece with the gradient magnet 10 or a housing of the gradient magnet 10, a frame part or the power supply connections. Welding, gluing or some other permanent connection of the connecting device 100 may be used, for example.

To increase the operating reliability, the connecting device 100 may also include redundant holding elements 110.

The connecting device 100 also includes a connecting element 150 that electrically and mechanically connects the connecting device 100 to the power supply cable 180. This connection may also be permanent or reversibly detachable in design. The advantages stated above are transferable.

In the illustrated exemplary embodiment, the connecting element 150 is configured as a screw connection, so the power supply cables 180 are detachably connected to the connecting device 100. The securing device for the holding element 110 or alternative embodiments that include a latching device, for example, may also be transferred or applied to the connecting element 150.

With the holding element 110 and the connecting element 150 connected, an oscillation damping device 130 that includes a spring element 131 (e.g., configured as a spring ring or spring ring element 131) is arranged. As described below, this arrangement opens up the possibility of keeping oscillations (e.g., vibrations of the gradient magnet 10) away from the relatively rigid power supply cables 180 (cf., cable cross-sections of the power supply cables or design as a coaxial cable), so the power supply cable 180 is almost completely mechanically decoupled from oscillations of the gradient magnet 10 that occur during operation.

The illustrated embodiment, in which the connecting device 100 is formed by the holding element 110, the oscillation damping device 150, which, in the exemplary embodiment, includes a single spring element 131, and the connecting element 150, allows simple adjustment of the damping behavior of the connecting device and an inexpensive construction.

The oscillation damping device may include a plurality of damping elements if particular oscillation forms or vibrations of the gradient magnet 10 require such.

The damping elements may be configured as spring elements 131 that may be easily adjusted to special requirements, although other damping elements such as simple leaf springs, oil-filled shock absorbers or telescopic spring elements 131 may also be used if, for example, a certain spatial direction of the movement is to be damped.

For the case of spatial direction limitation of damping, the oscillation damping device may, for example, include guide elements that fix a spatial direction of damping.

Such fixing of spatial directions of damping may also be provided using a ring spring element 132 that, in the illustrated exemplary embodiment, forms the oscillation damping device 130. The plane of the area of the ring (e.g., of the ring cross-section) determines the oscillation plane, in which the ring spring element 132 has a damping effect, while in the spatial direction of the axis of the ring opening (e.g., perpendicular to the cross-sectional area), the ring spring element 132 does not have a damping effect or only a slight one (e.g., to the extent that torsion of the spring element is possible).

The ring spring element 132 may be produced, for example, from a spring sheet metal strip and includes, as shown in FIG. 3, a plurality of (e.g., three) ring windings of the sheet metal strip located one above the other. The windings located one above the other form a closed structure.

This embodiment also enables the connecting device 100 to be formed purely from metal elements, for example.

The above is advantageous, since metal exhibits good thermal conductivity. Frictional heat that occurs during operation of the imaging system 1 due to the movement of the gradient magnet 10 relative to the power supply cable 180 may thus be quickly dissipated.

All metal components of the connecting device 100 may therefore be produced from the same metal. For example, surface sections of the connecting device 100 are designed as a heat sink.

A purely metal construction also enables, for example, the spring element 131 (e.g., the sheet metal or ring spring element 132) to contribute to the power supply of the magnetic system 10. By way of example, the operating current of the magnetic system 10 may flow by the connecting element 150, from the power supply cable 180, via the spring element 131, to the holding device 110 and thus be guided to a power supply connection of the magnetic system. Additional power supply cable sections may therefore be avoided in the connecting device 100.

The cable resistance of the connecting device may be adapted to the power supply cable resistance. The effective cable cross-section of a ring spring element may be at most 150 mm$^2$ or 120 mm$^2$ and at least 50 mm$^2$ or at least 80 mm$^2$ for this purpose, so excessive heating of the connecting device 100 due to the supply of power to the magnetic system 10 may be avoided. According to the exemplary embodiment, the cable cross-section of the ring spring element 132 may be about 100 mm$^2$, for example.

Copper, for example, may be considered, therefore, as material for the spring element 131 or the connecting device 100. Other materials in a suitable combination corresponding with the boundary conditions of the development may also be used.

Strong oscillations occur in the range of the natural frequencies of the magnetic system 10 of the exemplary embodiment.

To achieve extensive decoupling of the power supply cables 180 from these movements, the oscillation damping device 130 (e.g., the spring element 131) has a natural frequency that is lower than the lowest natural frequency of the oscillations of the magnetic system 10.

This may be assisted further, for example, in that the natural frequency of the oscillation damping device 130 or of the spring element 131 is higher or lower than the natural frequencies of the power supply cable 180 that is connected to the connecting device 100.

In the illustrated exemplary embodiment, the natural frequency of the oscillation damping device or of the spring element 131 may be selected in a range around 500 Hz (e.g., in a range between 400 Hz and 600 Hz or in a range between 480 Hz and 520 Hz). The exact ideal values depend on the type of magnetic system 10 or gradient coil and the length of the supply cables 180.

It is advantageous if the damping properties of the connecting device may be easily adapted to these boundary conditions.

This may occur, for example, by way of developments of the ring spring element 132. The sheet metal ring may, for example, have just two windings or a modified number of windings instead of the illustrated three windings. If, for example, a ring with three windings is to have a natural frequency of 760 Hz, in the case of a corresponding ring with only two windings but with an otherwise identical construction, this would shift to 495 Hz. In the case of a ring, which with three windings has a natural frequency of 930 Hz, this would shift to 600 Hz in the case of two windings. The natural frequency may be lowered by enlarging the cross-sectional area of the sheet metal ring or by a softer or thinner material, while the natural frequency may be raised accordingly by contrary measures, resulting in easy adaptability of the spring element 131.

Further adaptation measures of the oscillation damping device 130 may include, for example, the choice of damping as a function of the spatial direction.

Figure 5:
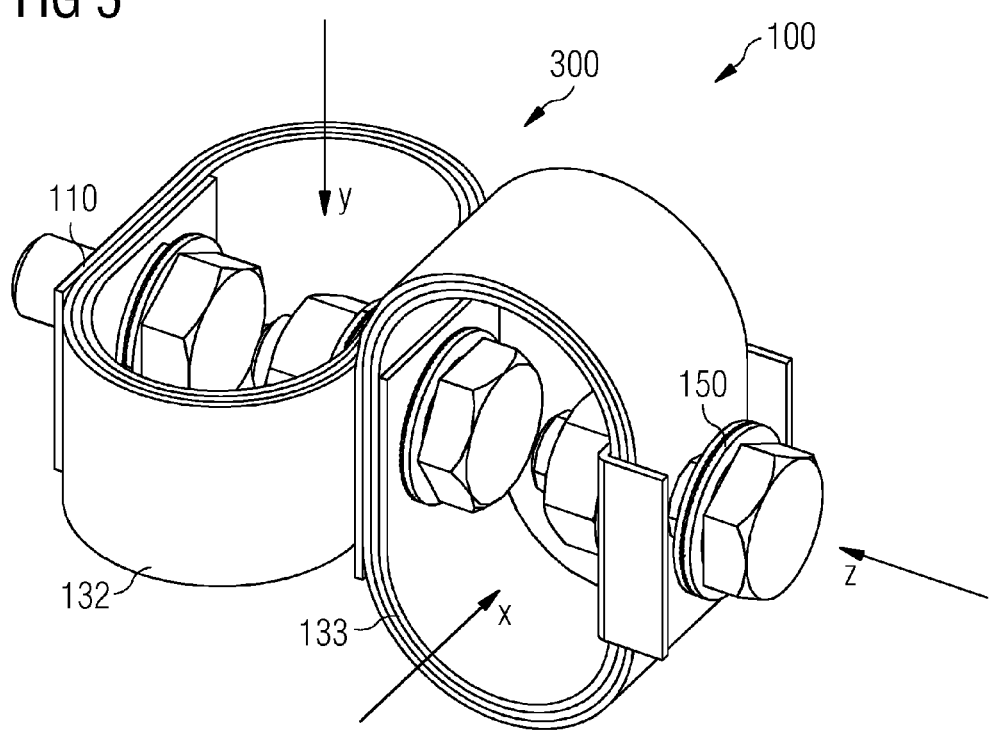
FIG. 5 shows a development of the exemplary embodiment according to FIG. 4 with a plurality of spring elements.

FIG. 5 shows a corresponding development of the connecting device 100 that achieves this. The oscillation damping device 130 includes a plurality of spring elements 131 that implement different damping for different spatial directions (e.g., as illustrated the x, y and z directions). In the exemplary embodiment of FIG. 5, two ring spring elements 132, 133 are coupled to each other for this purpose, and, for example, are screwed together. The cross-sectional area of the first ring spring element 132 is oriented orthogonally to the cross-sectional area of the second ring spring element 133. The damping effect of the spring rings is limited substantially to spatial directions that are parallel to the cross-sectional area, where the spatial direction of the axis of the opening of the spring ring is practically free from a damping effect due to the respective ring spring element 132 or 133. For the spatial direction of the axes of the opening, there is, therefore, an allocation of damping to individual ring spring elements 132 or 133, so damping may be adjusted independently of each other for these directions. Damping therefore occurs, for example, by way of the ring spring element 132 in FIG. 5 substantially in the x and z directions, but hardly in the y direction. By way of the second ring spring element 133, damping substantially occurs in the y and z directions, but hardly in the x direction. This independence of damping may be achieved for different spatial directions via different spring elements 131 that, in addition to quite different constructions, may also have the above-described adaptation possibilities of ring spring elements 132 in relation to strength, ring cross-sectional area and choice of material.

In the exemplary embodiment illustrated in FIG. 5, the choice of direction of damping may be achieved easily, for example, by rotating the ring spring elements 132 or 133 relative to each other, so the cross-sectional areas of the ring spring elements may be adjusted or set relative to each other.

The connection of the ring spring elements 132 or 133 may be provided with a latching device that enables simple choice of damping direction by way of different latching positions. The combination with the securing device, for example, may also be provided, and these may prevent further rotation of the ring spring elements 132 or 133 relative to each other, for example.

Suitable latching projections in each case, for example, in a regular grid in the connecting zone of the ring spring elements 132 or 133 may be provided as latching or securing devices or units. Guide plates that are additionally integrated, for example, in the illustrated screw connection in the manner of a washer and encompass the ring spring elements 132 or 133 such that a certain arrangement or a certain angle of rotation of the ring spring elements 132 or 13 relative to each other is specified, may be used. The guide plates may be easily replaced to adjust damping, for example.

The arrangement of damping elements or the spring or ring spring elements 132, 133 may be adjustable relative to each other.

A further modification of the damping properties of the spring element 131 may be provided, for example, by the change in the position of the holding element 110 or the connecting element 150 with respect to the spring element 131 or the oscillation damping device 130. Assembly of the holding element 110 or connecting element 150 at a plurality of different positions of the oscillation damping device 130 or spring element 131 or ring spring elements 132 may be provided, for example.

The ring spring element 132 may include a plurality of holes, for example, to implement a screw or plug-in connection at a plurality of positions. This is advantageous if the ring spring element 132 has an elliptical cross-sectional area. The arrangement of the holding element 110 or connecting element 150 may thus be adjustable with respect to the oscillation damping device 130.

As indicated above, the embodiment of the power supply cables 180 using a branch that connects a plurality of connecting devices 100 to a common power supply cable 180 has further advantages.

These relate also to the adaptability of damping the oscillation of the gradient magnet 10 with respect to the power supply cables 180. For example, a coupled damped system that has additional adjustment possibilities due to the adjustment of the length of the common section of the power supply cable 180 is therefore effectively created.

The present embodiments effectively provide possibilities that may extend the life of power supply cables 180 for a magnetic system 10 of an imaging system 1 and may significantly reduce the risk of the power supply cables 180 breaking.

The features of all exemplary embodiments or developments disclosed in the figures may be used in any desired combination. The connecting devices, magnetic systems or imaging systems described in detail above are merely exemplary embodiments that may be modified by the person skilled in the art in a wide variety of ways without departing from the field of the invention. The use of the indefinite article "a" or "an" does not prevent the relevant features from also being present several times.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A connecting device for a magnetic system of an imaging system, the connecting device comprising:
    a holding element for mechanical and electrical connection of the connecting device to a power supply connection of the magnetic system;
    a connecting element for the mechanical and electrical connection of the connecting device to a power supply cable for operation of the magnetic system; and
    an oscillation damping device comprising a spring ring element, wherein the power supply cable is mechanically connected to the outer surface of the spring ring element,
    wherein the oscillation damping device is operable to dampen oscillations of the magnetic system with respect to the connecting element that act on the connecting device by way of the holding element.

2. The connecting device as claimed in claim 1, wherein the connecting device is formed by the holding element and the connecting element separated by the oscillation damping device.

3. The connecting device as claimed in claim 1, wherein the spring element is operable to contribute to the supply of power to the magnetic system or to power transfer to the magnetic system.

4. The connecting device as claimed in claim 1, wherein the connecting device is substantially made of a conductive material.

5. The connecting device as claimed in claim 4, wherein the conductive material is a metal.

6. The connecting device as claimed in claim 1, wherein the spring ring element comprises a plurality of spring ring windings.

7. The connecting device as claimed in claim 6, wherein the plurality of spring ring windings comprises a sheet metal strip that is shaped into the plurality of ring windings arranged one above the other to form a closed structure.

8. The connecting device as claimed in claim 1, wherein the oscillation damping device comprises a plurality of damping elements,
    wherein each damping element of the plurality of damping elements is arranged for oscillation damping so as to be effective in a different spatial direction.

9. The connecting device as claimed in claim 1, wherein the oscillation damping device comprises a plurality of spring elements.

10. The connecting device as claimed in claim 9, wherein the plurality of spring elements comprises a plurality of spring rings.

11. The connecting device as claimed in claim 8, wherein the arrangement of the plurality of damping elements is adjustable with respect to each other, an arrangement of the holding element or an arrangement of the connecting element is adjustable with respect to the oscillation damping device, or a combination thereof.

12. A magnetic system for an imaging system, the magnetic system comprising:
    a connecting device comprising:
        a holding element for mechanical and electrical connection of the connecting device to a power supply connection of the magnetic system;
        a connecting element for the mechanical and electrical connection of the connecting device to a power supply cable for operation of the magnetic system; and
        an oscillation damping device comprising a spring ring element, wherein the power supply cable is mechanically connected to the outer surface of the spring ring element,
    wherein the oscillation damping device is operable to dampen oscillations of the magnetic system with respect to the connecting element that act on the connecting device by way of the holding element.

13. The magnetic system as claimed in claim 12, wherein during operation, the magnetic system is operable to execute an oscillatory movement with a natural frequency, and the oscillation damping device has a natural frequency that is lower than a lowest relevant natural frequency of the oscillatory movement of the magnetic system.

14. An imaging system comprising:
a magnetic system comprising:
a connecting device comprising:
a holding element for mechanical and electrical connection of the connecting device, the holding element comprising a power supply connection of the magnetic system;
a connecting element for the mechanical and electrical connection of the connecting device to a power supply cable for operation of the magnetic system; and
an oscillation damping device comprising a spring ring element, the oscillation damping device separating the holding element from the connecting element,
wherein the oscillation damping device is operable to dampen oscillations of the magnetic system that act on the connecting device by way of the holding element, with respect to the connecting element.

15. The imaging system as claimed in claim 14, wherein during operation, the magnetic system is operable to execute an oscillatory movement with a natural frequency,
wherein the oscillation damping device has a natural frequency that is lower than a lowest relevant natural frequency of the oscillatory movement of the magnetic system; and
wherein the natural frequency of the oscillation damping device is higher than natural frequencies of a power supply arrangement connected to the connecting device.

16. The imaging system as claimed in claim 14, wherein the power supply cable is a cable with an internal conductor and an external conductor,
wherein the magnetic system comprises a plurality of connecting devices, the plurality of connecting devices comprising the connecting device, and
wherein each connecting device of the plurality of connecting devices is associated with the internal conductor or the external conductor.

17. The imaging system as claimed in claim 16, wherein the power supply cable is a coaxial cable.

18. The imaging system as claimed in claim 15, wherein the power supply cable is a cable with an internal conductor and an external conductor,
wherein the magnetic system comprises a plurality of connecting devices, the plurality of connecting devices comprising the connecting device, and
wherein each connecting device of the plurality of connecting devices is associated with the internal conductor or the external conductor.

19. The imaging system as claimed in claim 18, wherein the power supply cable is a coaxial cable.

20. A method for connecting a power supply cable to a magnetic system of an imaging system, the method comprising:
mechanically and electrically connecting a connecting device, using a holding element, to a power supply connection of the magnetic system; and
mechanically and electrically connecting the connecting device, using a connecting element, to a power supply cable for operation of the magnetic system,
damping, with an oscillation damping device of the connecting device, oscillations of the magnetic system that act on the connecting device by way of the holding element, with respect to the connecting element, the oscillation damping device comprising a spring ring element, wherein the power supply cable is mechanically connected to the outer surface of the spring ring element.

* * * * *